(12) United States Patent
Black et al.

(10) Patent No.: US 6,969,959 B2
(45) Date of Patent: Nov. 29, 2005

(54) ELECTRONIC CONTROL SYSTEMS AND METHODS

(75) Inventors: Richard L. Black, Gilbertsville, PA (US); Graham Christensen, Middletown, MD (US); Benjamin Aaron Johnson, Lansdale, PA (US); Shawn L. Leichliter, Allentown, PA (US); Robert C. Newman, Jr., Emmaus, PA (US); Stephen Spencer Thompson, Quakertown, PA (US); Chenming Wu, Allentown, PA (US)

(73) Assignee: Lutron Electronics Co., Inc., Coopersburg, PA (US)

( * ) Notice: Subject to any disclaimer, the term of this patent is extended or adjusted under 35 U.S.C. 154(b) by 231 days.

(21) Appl. No.: 10/013,746

(22) Filed: Dec. 10, 2001

(65) Prior Publication Data

US 2003/0006710 A1   Jan. 9, 2003

Related U.S. Application Data

(60) Provisional application No. 60/303,508, filed on Jul. 6, 2001.

(51) Int. Cl.⁷ ............................................. H05B 37/02
(52) U.S. Cl. ................. 315/307; 315/194; 315/294
(58) Field of Search ................. 315/307, 116, 129, 315/130, DIG. 7, 241 R, 194, 294; 323/282, 323/17, 19, 20; 318/768, 786, 805, 810; 361/18, 86; 363/132, 98, 17, 56

(56) References Cited

U.S. PATENT DOCUMENTS

| | | | |
|---|---|---|---|
| 3,679,965 A | 7/1972 | Wilkinson | 323/19 |
| 3,835,368 A | 9/1974 | Williams | 323/17 |
| 4,350,948 A | 9/1982 | Meroni | 323/282 |
| 4,760,324 A | 7/1988 | Underhill | 323/282 |
| 4,855,858 A | 8/1989 | Boertzel et al. | 361/18 |
| 5,021,679 A | 6/1991 | Fairbanks et al. | 307/66 |
| 5,109,186 A | 4/1992 | Lieu | 323/299 |
| 5,111,380 A | 5/1992 | Nilssen | 363/132 |

(Continued)

OTHER PUBLICATIONS

Busch Universal dimmer Product Literature, 6 pages.

(Continued)

*Primary Examiner*—James Vannucci
(74) *Attorney, Agent, or Firm*—Woodcock Washburn LLP

(57) ABSTRACT

An apparatus in an electronic control system allows two or three wire operation. A power supply can supply power to the enclosed circuitry in both two and three wire installations. Two separate zero cross detectors are used such that timing information can be collected in both two and three wire installations. Both zero cross detectors are monitored and are used to automatically configure the electronic control. Over voltage circuitry senses an over voltage condition across a MOSFET which is in the off state and turns the MOSFET on so that it desirably will not reach the avalanche region. Over current circuitry senses when the current through the MOSFETs has exceeded a predetermined current threshold and then turns the MOSFETs off so they do not exceed the MOSFETs' safe operating area (SOA) curve. Latching circuitry is employed to keep the protection circuitry in effect even after a fault condition has cleared. Lockout circuitry is used to prevent one protection circuit from tripping after the other circuit has already tripped from a fault condition. The protection circuitry output is desirably configured such that it can bypass and override the normal turn on and turn off impedance and act virtually directly on the gates of the MOSFETs. Preferably, the system has a high efficiency switching type power supply in parallel with a low frequency controllably conductive device.

19 Claims, 14 Drawing Sheets

U.S. PATENT DOCUMENTS

| | | | |
|---|---|---|---|
| 5,224,029 A | 6/1993 | Newman, Jr. | 363/48 |
| 5,278,490 A | 1/1994 | Smedley | 323/284 |
| 5,291,384 A | 3/1994 | Mammano et al. | 363/17 |
| 5,670,858 A * | 9/1997 | Heath | 318/768 |
| 5,737,163 A | 4/1998 | Newlin | 361/18 |
| 5,818,214 A | 10/1998 | Pelly et al. | 323/351 |
| 5,914,865 A | 6/1999 | Barbehenn et al. | 363/21 |
| 5,923,154 A | 7/1999 | Moller | 323/222 |
| 5,959,443 A | 9/1999 | Littlefield | 323/287 |
| 6,222,353 B1 | 4/2001 | Pattamatta et al. | 323/269 |

OTHER PUBLICATIONS

Power Integrations, Inc., Product Literature TNY253/254/255 TinySwitch Family Energy Efficient, Low Power Off-Line Switchers, 20 pages, Jul. 2001.

STMicroelectronics, "High Voltage Linear Regulator Power I.C.", VB408, VB408B, VB408FI, Sep. 1999, 1-8.

* cited by examiner

ELECTRONIC CONTROL SYSTEMS AND METHODS

CROSS-REFERENCE TO RELATED APPLICATIONS

This application claims the benefit of U.S. Provisional Application No. 60/303,508, filed Jul. 6, 2001, the entire disclosure of which is hereby incorporated by reference.

FIELD OF THE INVENTION

The present invention relates in general to electronic control circuits and systems, and more particularly, to lighting control circuits and systems.

BACKGROUND OF THE INVENTION

There are many applications where it is desirable to control the amount of average electrical power delivered to a load. One example of such an application is the use of a lighting dimmer to control the output of a lamp. A dimmer typically functions by controlling the conduction of current through the load. A controllably conductive device is synchronized to the AC line voltage and is controlled to conduct for a predetermined interval in each half cycle of the AC line voltage. That is, the load only receives power (is on) for a portion of the AC line voltage half cycle. The longer the conduction time, the more power delivered to the load. By the same logic, the shorter the conduction time, the less power delivered to the load.

There are primarily two methods for controlling AC loads such as lighting loads, forward phase control and reverse phase control. A controllably conductive device is a device whose conduction can be controlled by an external signal. These include devices such as metal oxide semi-conductor field effect transistors (MOSFET), insulated gate bi-polar transistors (IGBT), bi-polar junction transistors (BJT), triacs, silicon controlled rectifiers (SCRs), relays, switches, vacuum tubes and the like. These two control methods utilize the conductive and non-conductive states of a controllably conductive device to control the power in a load and synchronize the conduction and non-conduction of the controllably conductive devices to zero crosses of the source of AC line voltage.

The method of forward phase control, as shown in FIG. 13, synchronizes a controllably conductive device to the source of AC power and controls the controllably conductive device to be non-conductive over the first portion of an AC line voltage half cycle, then controls the controllably conductive device to be conductive over the remaining portion of the AC line voltage half cycle. In the method of reverse phase control, as shown in FIG. 14, the periods of non-conduction and conduction are reversed with respect to time. That is to say, the controllably conductive device is controlled to be conductive during the first portion of the AC line voltage half cycle followed by a period of non-conduction in the same half cycle. The method of reverse phase control is often used for operation of capacitive loads such as electronic transformers.

In forward phase control based control systems the controllably conductive device is often a triac or an SCR. These devices can be controlled to be non-conductive or conductive. However, if they are controlled to be conductive, they can only be made non-conductive by allowing the current through them to go to zero. Due to this characteristic, these types of controllably conductive devices are not used for reverse phase control based control systems where the ability to enable and disable conduction is required.

Electronic controls need to derive a power supply in order to power their associated electronics. Additionally, many controls require line frequency related timing information. Controls which only have two power terminals have one of these terminals (the hot terminal) connected to a hot wire of a source of AC power and the other terminal (the dimmed hot terminal) connected to a first terminal of a load. Controls with this type of connection are often referred to as "two wire" controls. Two wire controls which are connected in series with their loads must charge their power supplies and obtain timing information through this load. The load can often have a wide range of input impedance. As such, the operation of the power supply and timing circuit is often compromised in the two wire connection scheme. However, a two wire connection is necessary when the control is wired in an application where a neutral wire is not available.

Controls which have connections to the hot wire, load, and neutral wire are often referred to as "three wire" controls. When a neutral wire from the source of AC power is available for connection to a neutral terminal of the control, the power supply and zero cross information can be derived independently of the connected load, thereby enhancing performance. In many applications, a neutral wire from the source of AC power is not available. Therefore, a control is needed that can operate correctly as either a two wire or three wire control, thereby allowing the control to be used in a broad range of field applications with great flexibility.

Prior art for developing a non-isolated low voltage power supply from a high voltage source, such as the AC line voltage, used circuits such as a cat ear power supply. Such a system would conduct at or near the line voltage zero cross so as to recharge an energy storage capacitor. Such systems typically operate properly in the region about 1 millisecond from the zero crossing of the line voltage. Operation outside that time window can cause excessive power to be dissipated in the power supply.

The cat ear power supply has relatively high peak and high average input currents with respect to the average current supplied to the connected DC load. This high average input current presents a significant problem when this supply technology is used with electronic low voltage (ELV) load types on phase control dimmers connected in a two wire mode. A supply for low voltage control circuitry is needed that has low average input currents through the high voltage load. Also, typical prior art power supplies have been relatively inefficient so that they require higher average input currents to supply the power requirements of typical prior art dimmers.

Another disadvantage of prior art power supplies for lighting control devices is that power losses in the power supplies increase with the amount of current required to be delivered by the power supply. The trend in modern lighting controls is to incorporate more features and functionality. These features and functionality require ever increasing amounts of current to be delivered by the power supply. Hence, it is desired to provide a power supply for a lighting control able to efficiently supply greater amounts of current than are presently available from typical prior art power supplies without the power losses associated with such prior art power supplies.

There are a variety of fault conditions to which lighting controls may be subject, including, for example, over voltage and over current conditions. Over voltage conditions can be caused by, for example, the turning on and off of nearby and connected magnetic loads, capacitive coupling to parallel wire runs with sharp transient loads, lightning strikes, etc. Over current conditions can be caused by, for example, short circuited loads, connected loads exceeding the controls rating, mis-wire conditions, etc. Semiconductor devices, such as MOSFETs, have limits as to how much voltage and current they can withstand without failure. In order to protect a control that uses these semiconductor devices from failure, these limits are preferably never exceeded. Fast detection of fault conditions, and fast reaction thereto is desirable in order to protect these devices.

In contrast, during normal operation, the rates of transition between conductive and non-conductive states of these semiconductor devices are controlled to be slow. These slow rates of transition are used, for example, to limit the voltage and current waveforms as seen by the load, to comply with radiated and conducted radio frequency interference (RFI) limits, or to limit voltage ringing caused by inductive power wiring. However, these slow rates of transition during normal operation are too slow for adequate protection of these semiconductor devices. Thus, there is a need for protection circuitry that operates to cause fast rates of transition under fault conditions, while still allowing these semiconductor devices to be operated with slow rates of transition under normal operating conditions.

SUMMARY OF THE PRESENT INVENTION

The present invention is directed towards an apparatus in an electronic control system which will allow two or three wire operation. According to aspects of the invention, the apparatus employs a high efficiency power supply which can supply power to the operating circuitry of the electronic control system in both two and three wire installations.

According to another aspect of the invention, the apparatus employs a detector that detects the presence of a neutral wire connection and outputs a signal responsive to the detected neutral wire connection to cause the electronic control system to operate in a two wire mode when the neutral wire connection is absent and to operate in a three wire mode when the neutral wire connection is present.

According to other aspects of the invention, the apparatus employs a zero cross detector which can operate in both two and three wire modes. In an embodiment, the zero cross detector comprises a hot zero cross detector that generates a hot zero cross signal and a neutral zero cross detector that generates a neutral zero cross signal, and a microprocessor responsive to the zero cross signals to cause the apparatus to operate in one of the two wire and three wire modes.

According to yet another aspect of the invention, the apparatus employs a system for stabilizing the zero crossing signal received by the electronic control system when the system is operating electronic low voltage transformer connected loads.

Another embodiment of the present invention is directed toward the protection of controllably conductive devices such as semiconductor devices like MOSFETs and IGBTs used in an electronic control system. Over voltage circuitry senses an over voltage condition across a controllably conductive device which is in the non-conductive state and controls the controllably conductive device to be conductive so as to remove the over voltage condition. Over current circuitry senses when the current through a controllably conductive device has exceeded a predetermined current threshold and controls the controllably conductive device to be non-conductive so as to ensure the safe operating area of the controllably conductive device is not exceeded. The protection circuitry output is desirably configured such that it can bypass and override the normal control path of the controllably conductive device and cause the controllably conductive device to transition rapidly between conduction and non-conduction states.

According to further aspects of the invention, latching circuitry is employed to keep the results of the protection circuitry in effect even after the fault condition has cleared. Lockout circuitry is used to prevent one protection circuit from tripping after the other protection circuit has already tripped from a particular fault condition.

The foregoing and other aspects of the present invention will become apparent from the following detailed description of the invention when considered in conjunction with the accompanying drawings.

BRIEF DESCRIPTION OF THE DRAWINGS

For the purpose of illustrating the invention, there is shown in the drawings an embodiment that is presently preferred, it being understood, however, that the invention is not limited to the specific methods and instrumentalities disclosed. In the drawings.

DESCRIPTION OF EXEMPLARY EMBODIMENTS AND BEST MODE

An embodiment of the present invention is directed to an electronic control system and in particular a lighting controller that can automatically determine whether to operate in two wire mode or three wire mode (i.e., to operate with or without a neutral wire connection). The controller senses whether there is a neutral wire connection to the electronic control system and adjusts its operation accordingly. The electronic control system automatically selects and continuously monitors the connection scheme. An embodiment is directed toward an electronic control system such as a lighting controller or dimmer; however, the invention has broader application in other electronic controls.

Figure 1:
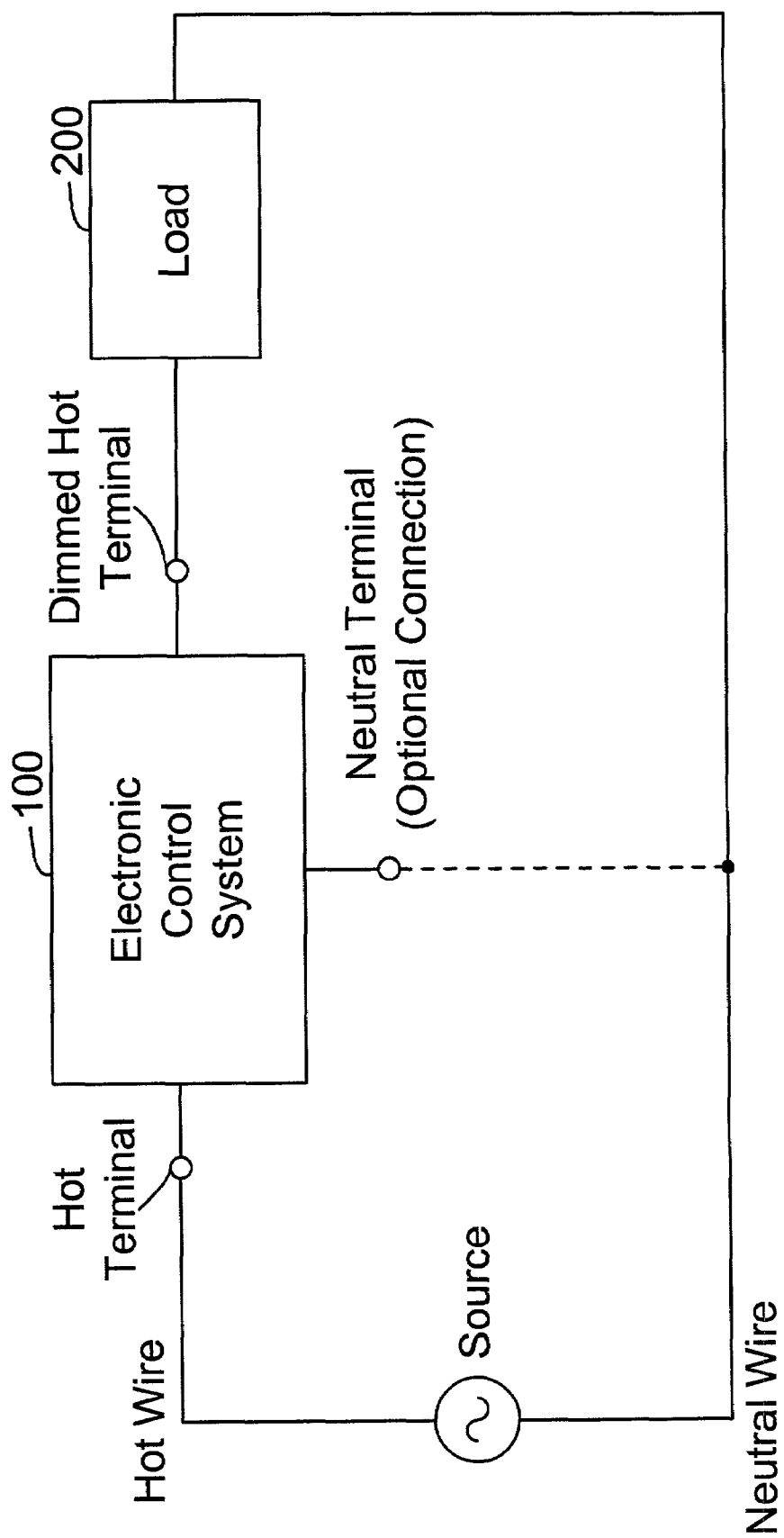
FIG. 1 is a high level block diagram of an exemplary system in accordance with the present invention.

FIG. 1 is a high level block diagram of an exemplary system in accordance with the present invention. An electronic control system 100, also referred to herein as a lighting controller or a dimmer, is preferably connected between an input source, such as an AC line voltage, and a first terminal of a load 200, such as an incandescent lamp or an electronic low voltage (ELV) transformer with a connected lamp load. A typical AC line voltage comprises a 120 volt, 60 Hz, single phase power source. The AC line may also comprise a 220 to 240 volt, 50 Hz single phase power source, or the like.

The electronic control system 100 comprises a hot terminal, a dimmed hot terminal, and a neutral terminal which is optionally connected to the neutral wire of the AC line. The neutral wire of the AC line is also connected to a second terminal of the load 200.

The electronic control system 100 controls the flow of current to the load 200 using either forward phase control or reverse phase control based on a predetermined selection. For electronic low voltage loads, it is desirable to operate with reverse phase control because electronic low voltage loads have a capacitive input impedance. If forward phase control is used to control electronic low voltage loads, a large transient current can flow when the controllably conductive device of the electronic control system transitions from a non-conductive to a conductive state.

The electronic control system 100 detects whether the neutral wire is connected and adjusts its operation accordingly. In particular, as described in further detail below a microprocessor monitors the output of a detector, and determines which of two wire or three wire mode should be used by the electronic control system to control the connected load.

Figure 2:
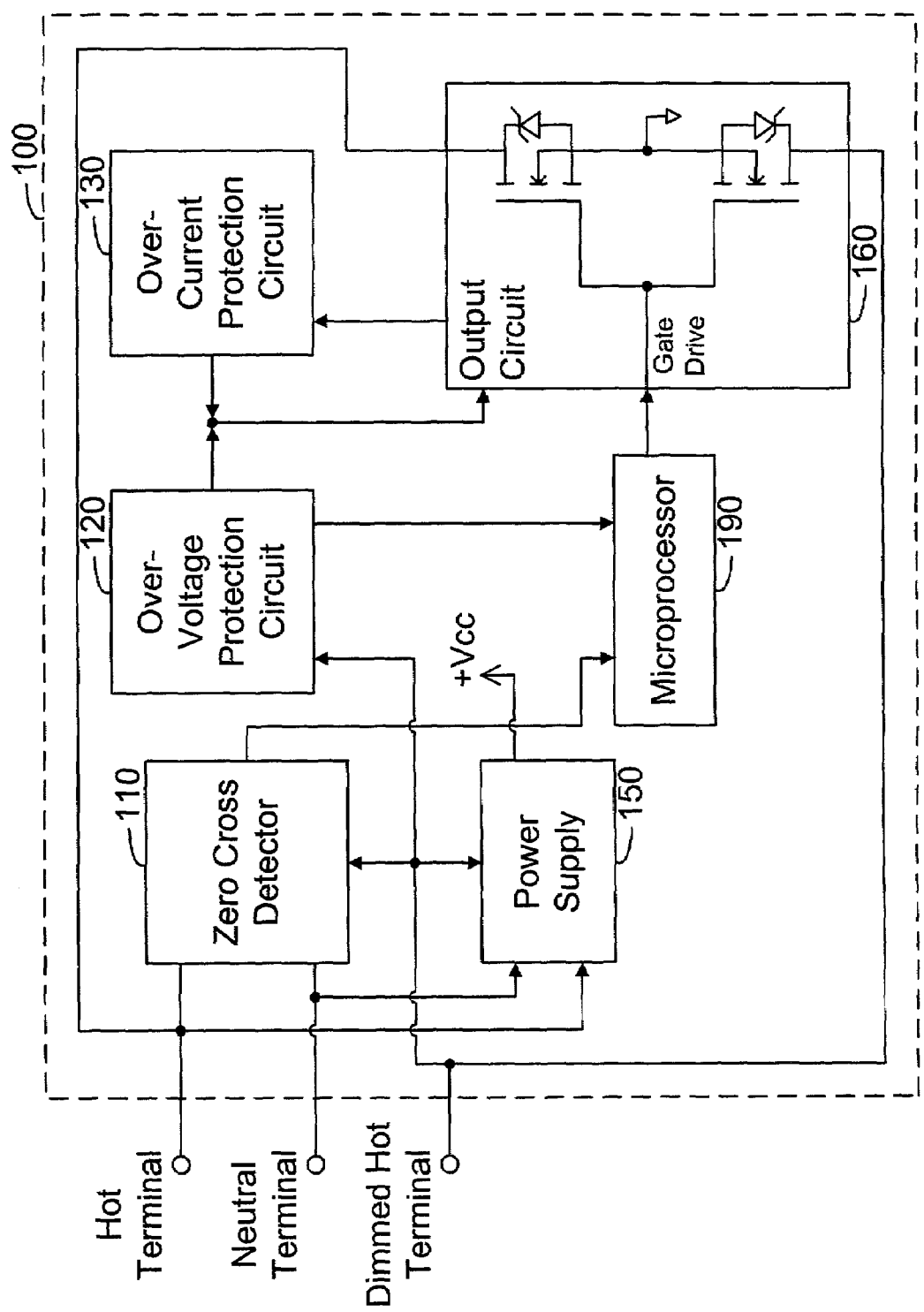
FIG. 2 is a block diagram of an exemplary control system in accordance with the present invention.

FIG. 2 is a block diagram of an exemplary electronic control system 100, and FIGS. 3, 4, 5, and 6 are circuit schematic diagrams of various portions of an exemplary electronic control system 100. The electronic control system 100 comprises a zero cross detector 110, an over voltage protection circuit 120, an over current protection circuit 130, a power supply 150, output circuit 160, and a microprocessor 190. The hot terminal and neutral terminal are connected to the zero cross detector 110, and the dimmed hot terminal is provided to the over voltage protection circuit 120.

The power supply 150 is preferably a switching power supply with high efficiency (e.g., an efficiency above about 50%). More particularly, with respect to FIG. 3, the power supply 150 is supplied with sufficient energy in both the two wire mode and three wire mode. The diodes D1, D2, D60, D61, and the two body diodes of the MOSFETs Q101 and Q102 (in output circuit 160 shown in FIG. 5) form a full wave bridge for power supply current to flow in both AC line voltage half cycles.

In the case of an electronic control system with the neutral terminal connected to the neutral wire of the AC line voltage (three wire mode), the bus capacitor C10 of the power supply 150 charges by drawing current from the source of AC power through the hot wire and neutral wire in the negative half cycle of the AC line voltage and through the hot wire and the load in the positive half cycle of the AC line voltage. In the case of a two wire mode, the bus capacitor C10 is charged in both half cycles through the load when the absolute value of the AC line voltage is greater than the bus capacitor voltage $V_{BUS}$ and the controllably conductive devices are non-conductive. The diode D10 of FIG. 3 prevents the bus capacitor C10 from discharging through other connected circuitry. The bus capacitor C10 is used as a source of high voltage DC to power an efficient power converter to provide low voltage DC to operate the control circuits of the electronic control system.

The efficient power converter operates as follows using the well known buck converter topology. The efficient power converter includes the following principal components U10, L10, C13, and a regulation circuit including principal components U11, Z10, and R12. When the voltage across capacitor C13 is below the voltage threshold determined by the series combination of zener Z10 and the LED diode drop of optocoupler U11, current will not flow through those components, thus the opto-coupled transistor of optocoupler U11 will be off. When the transistor is off, no current can flow from the enable pin 4 of controller U10 (such as, for example, a TNY253 IC manufactured by Power Integrations, Inc. San Jose, Calif.) to its source pin 2,3, thereby enabling controller U10 to begin switching in order to raise the output voltage level of C13. The controller U10 will then turn on its internal MOSFET, thereby allowing current to flow from the drain to the source, through the inductor L10 and into the output capacitor C13. The rate of rise of this current is limited by the inductance of inductor L10. When the current in the internal MOSFET reaches the internally set threshold of controller U10, the internal MOSFET is turned off. The current will continue to flow around the loop defined by inductor L10, capacitor C13, and diode D11 until the current in the inductor reaches zero. This switching cycle is repeated at a maximum rate of 44 kHz as set by controller U10, until the voltage across capacitor C13 exceeds the voltage threshold determined by the series combination of zener Z10 and the LED diode drop of optocoupler U11. When this voltage threshold is exceeded, current will begin to flow through those components, thereby turning the opto-coupled transistor of optocoupler U11 on. When this transistor turns on, the enable pin 4 of controller U10 is thereby connected to the source pin 3, and in accordance with the operation of controller U10, switching is terminated. Additionally, the enable pin 4 can be used to select a running or non-running mode of the power supply. This pin can be used to constrain the operation of the power supply to selected times of the AC line voltage half cycle. Since switch mode power supplies generate electrical noise, it is advantageous to constrain the operation of the power supply to times when other noise sensitive circuits are not operating.

In prior electronic control systems which include a power supply utilizing a high frequency switching converter, the power supply is connected to draw current directly from a low impedance source such as an AC line voltage. In the apparatus of an embodiment of the invention, the power supply, utilizing a high frequency switching converter, draws current through the load which may typically have a high impedance.

It is desirable to provide an over voltage protection circuit 120 and an over current protection circuit 130 that will sense and react to an over voltage across or an over current condition through a controllably conductive device in an electronic control system to protect the electronic control system from damage.

Figure 4:
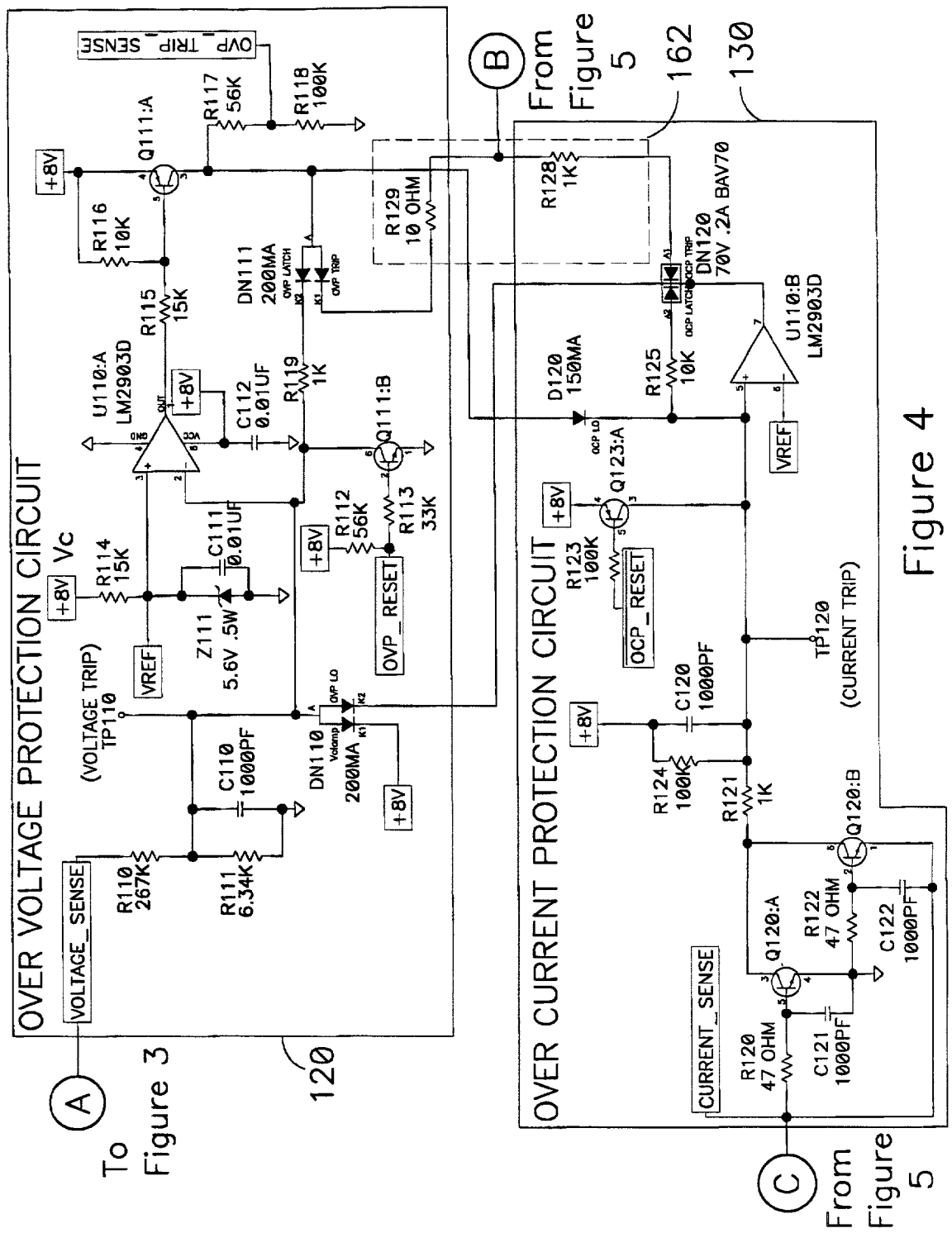
FIG. 4 is a circuit schematic diagram of another portion of an exemplary control system in accordance with the present invention.

Circuit details of an exemplary over voltage protection circuit 120 and an exemplary over current protection circuit 130 are shown in FIG. 4. At startup, a reference voltage $V_{REF}$ for the comparators U110:A, U110:B is derived from the 8 V MOSFET drive rail, Vc, through the current limiting resistor R114, voltage regulating zener Z111, and a noise decoupling capacitor C111. It is desirable to power the comparators in IC U110 with 8V as opposed to 5V to allow the use of a sharp-knee 5.6V zener as the reference voltage to which the detection circuits are compared. A well regulated voltage reference tightens the tolerancing window on the detection circuits.

Figure 5:
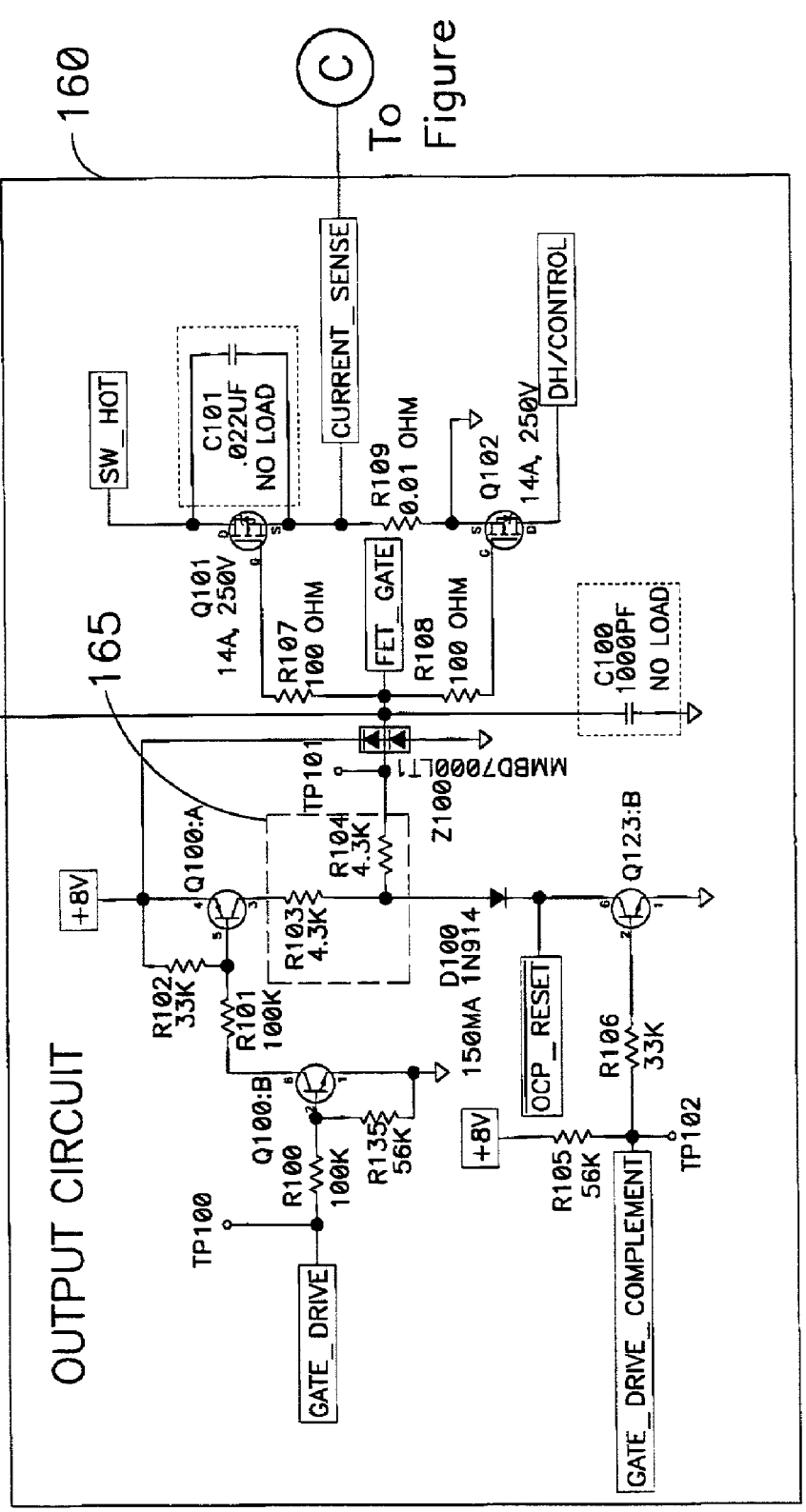
FIG. 5 is a circuit schematic diagram of another portion of an exemplary control system in accordance with the present invention.
Figure 7:
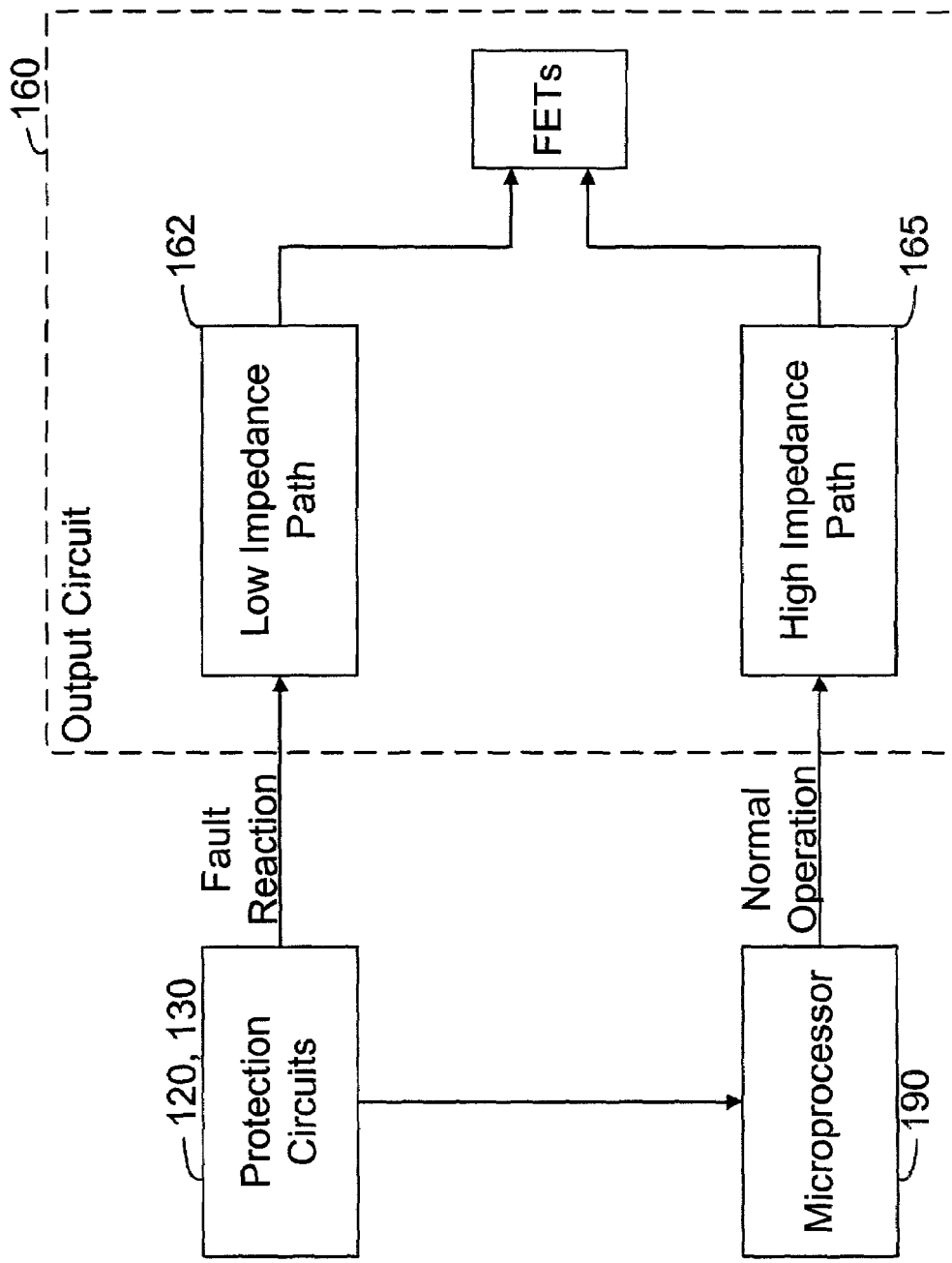
FIG. 7 is a simplified block diagram of an exemplary transistor driver in accordance with the present invention.

FIG. 7 contains a simplified block diagram of an exemplary output circuit. Circuit details of an exemplary output circuit 160 are shown in FIG. 5. It is well known that the rate of transition between the states of conduction for a MOSFET can be controlled by selecting the impedance of the drive circuit. The higher the impedance the slower the transition rate. The output transistors Q101 and Q102 are driven through high impedance path 165, during normal operation, and through low impedance path 162 (FIG. 4) during a fault condition. The microprocessor 190 is connected to the high impedance path 165 and the protection circuits 120, 130. The protection circuits 120, 130 are also connected to the low impedance path 162. When the protection circuits 120, 130 detect a fault, the low impedance path 162 is activated. The low impedance path 162 is only active when a fault is detected. The fault path overrides the normal path provided by the high impedance path 165.

In normal operation, the high impedance path 165 is used. The transistors Q101 and Q102 are turned on through resistors R103 and R104, and are turned off through resistor R104. During normal operation, transistor control is provided by two microprocessor ports, Gate Drive and Gate Drive Complement (shown in FIG. 6). To turn on the MOSFETs Q101 and Q102, Gate Drive is driven high, thereby turning on transistor Q100:B (shown in FIG. 5), thereby turning on transistor Q100:A, which applies 8V to the gates of MOSFETs Q101 and Q102 through a resistance set by the series combination of resistors R103 and R104. When Gate Drive is high, Gate Drive Complement is low thereby turning off transistor Q123:B, thus opening the current path from 8V to circuit common.

To turn off the MOSFETs Q101 and Q102, Gate Drive is pulled low, thereby turning transistor off Q100:B, thereby turning off transistor Q100:A, opening the current path from the 8V rail to the gates of MOSFETs Q101 and Q102 gates. Gate Drive Complement is driven high, turning on transistor Q123:B, thereby discharging the gates of MOSFETs Q101 and Q102 through the resistor R104.

The MOSFETs Q101 and Q102 get driven through the high impedance path to reduce RFI emissions during normal operation. During a fault condition, the MOSFETs Q101 and Q102 are driven through the low impedance path to shut them down quickly.

During normal operation, the voltage on the inverting input terminal of comparator U110:A (the Over voltage protection circuit (OVP) comparator) is less than the reference voltage of 5.6V so the output of this comparator U110:A is high impedance. This high impedance will keep the transistor Q111:A off and the MOSFETs Q101 and Q102 are unaffected. The microprocessor port OVP_RESET (shown in FIG. 6) is low whenever the MOSFETs Q101 and Q102 are off, thereby turning off transistor Q111:B and enabling the detector.

Additionally, the reference voltage on the inverting terminal of comparator U110:B (the Over current protection circuit (OCP) comparator) is less than the 8V on the non-inverting terminal so the output of this comparator U110:B is high impedance and the MOSFETs Q101 and Q102 are unaffected. Diodes DN111:1 and DN120:1 provide isolation between the MOSFETs Q101 and Q102 and the protection circuitry 120, 130.

During an over voltage fault condition, as the voltage across the MOSFETs Q101 and Q102 rises so does the divided down voltage at resistors R110 and R111's common node. When this node's voltage, which is also connected to comparator U110:A's inverting terminal, exceeds the reference voltage $V_{REF}$, the output of the comparator U110:A will pull low, thereby turning on transistor Q111:A, thereby applying drive voltage to the gates of MOSFETs Q101 and Q102 via a low impedance path set by resistor R129. The low impedance path allows the MOSFETs Q101 and Q102 to turn on at a faster rate than during the normal mode of operation. Because voltage transients can be on the order of several thousand volts, the input voltage to the OVP comparator is safely clamped by diode DN110:1 to a maximum of about 8.6V.

The OVP circuit 120 is latched on, even after the fault condition is clear, by virtue of the feedback action of diode DN111:2. This feedback keeps the inverting terminal voltage of the comparator U110:A above the reference voltage $V_{REF}$, thereby keeping transistor Q111:A on.

The OVP latch is cleared by briefly driving the microprocessor port OVP_RESET high, thereby turning transistor Q111:B on and driving pin 2 of comparator U110:A below the reference voltage $V_{REF}$, thereby driving the output of the comparator U110:A to high impedance.

In order to prevent an oscillatory condition from occurring between over voltage protection and over current protection when one protection circuit trips, the other protection circuit is locked out. When over voltage protection circuit 120 activates, over current protection circuit 130 is disabled via diode DN120. The anode of DN120 will be at approximately 7.4V when the over voltage protection circuit 120 is activated, and this will hold the non-inverting terminal of the over current protection comparator U110:B high enough above the reference voltage $V_{REF}$, even if the over current protection circuit 130 tries to pull the non-inverting terminal low. This effectively disables the over current protection comparator U110:B.

During an over current fault condition, as the current through the MOSFETs increases, the voltage across resistor R109 (in output circuit 160) increases. As the voltage approaches 0.6V, either transistor Q120:A or Q120:B will begin to turn on depending on the direction of current flow. The turn on of the transistors Q120:A, Q120:B will pull the non-inverting terminal of the comparator U110:B down below the reference voltage $V_{REF}$, thereby switching the comparator's output low. This low output quickly turns off the MOSFETs Q101 and Q102 through diode DN120:1 and resistor R128. Noise filtering is provided by resistors R124 and R121, and capacitors C120, C121, and C122.

The over current protection circuit 130 is latched on, even after the fault condition has cleared, by virtue of the feedback action of diode DN120:2. This feedback keeps the non-inverting terminal of the comparator U110:B below the reference voltage $V_{REF}$, thereby keeping the output low. The over current protection circuit is reset when Gate Drive Complement goes high, turning on transistor Q123:B (in output circuit 160), which then turns on transistor Q123:A, thereby driving the non-inverting terminal of the comparator U110:B to 8V and clearing the latch.

When the over current protection circuit 130 activates, the over voltage protection circuit 120 is disabled via diode DN110. When the output of the over current protection comparator U110:B goes low, the inverting terminal of the over voltage protection comparator U110:A is pulled to approximately 0.8V, thereby preventing the over voltage protection circuit from activating.

The voltage comparators U110:A and U110:B provide fast reaction speed and accuracy and work well across a wide temperature range. Each comparator has a specified typical response time of about 1.5 μsec with about a 5 mV overdrive. The input offset voltage has a specified typical value of about 2.0 mV at 25° C. The input to output response time of the comparators with inputs driven to the rails is about 90 nanosec. In the over current protection circuit 130, the time from the input $V_{REF}$ crossing to the MOSFET's 90% off point was measured to be about 3.5 μsec. In the over voltage protection circuit 120, the time from the input $V_{REF}$ crossing to the MOSFET's 90% on point was measured to be about 2.0 μsec.

Figure 8:
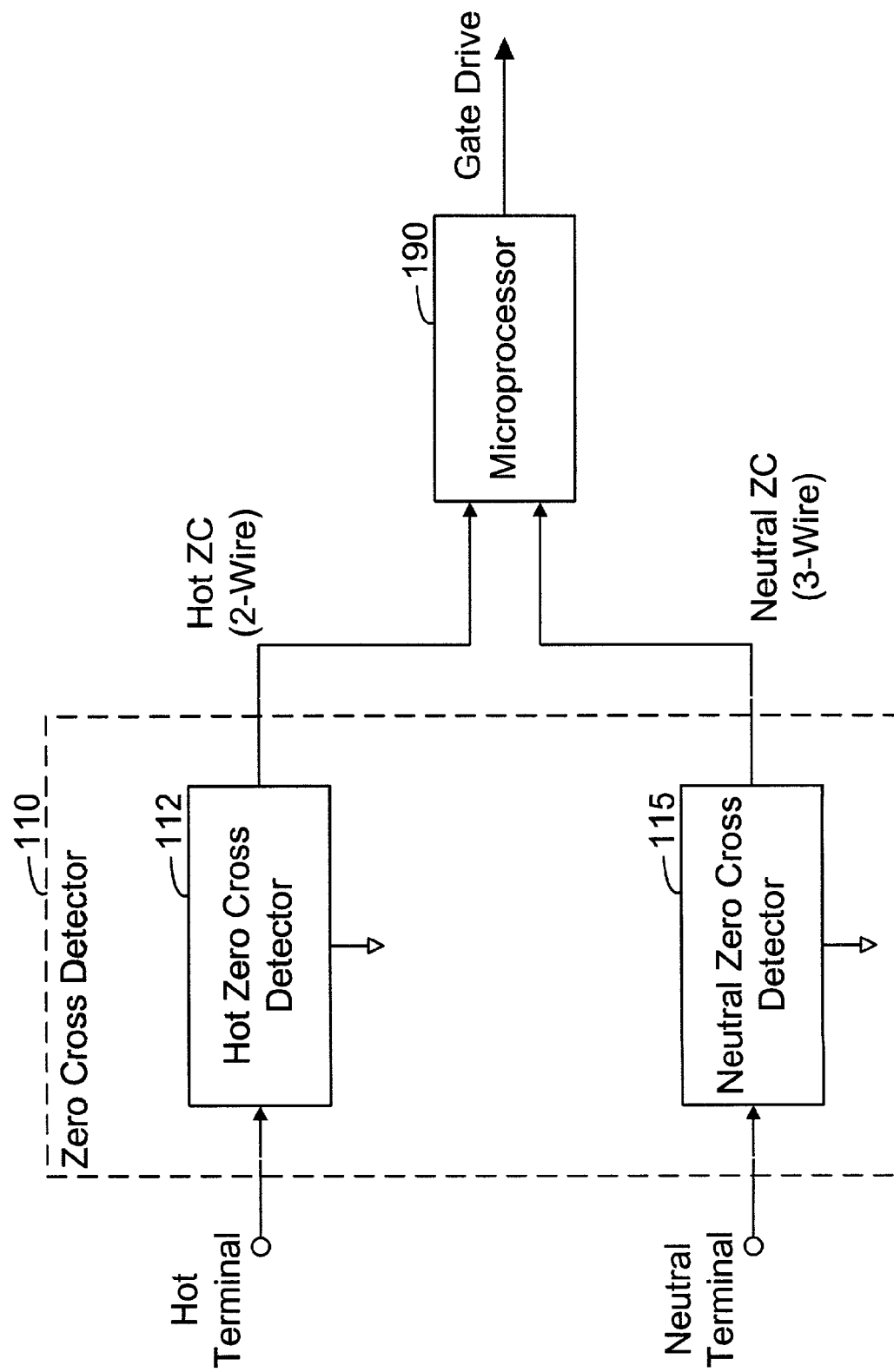
FIG. 8 is a simplified block diagram of an exemplary zero cross detector in accordance with the present invention.

FIG. 8 is a simplified block diagram of an exemplary zero cross detector 110. The zero cross detector 110 comprises a hot zero cross detector 112 that provides a hot zero cross detection signal and a neutral zero cross detector 115 that provides a neutral zero cross detection signal when the neutral terminal is connected to a neutral wire. The microprocessor 190 monitors the output of the detectors 112 and 115. If a neutral zero cross detection signal is sensed by the microprocessor 190, it is determined that the connection is a three wire connection and the three wire mode is activated in which the neutral zero cross detection signal from the neutral detector 115 is used for timing. Otherwise, it is determined that the connection is a two wire connection and the two wire mode is activated in which the hot zero cross detection signal from the hot detector 112 is used for timing.

Figure 3:
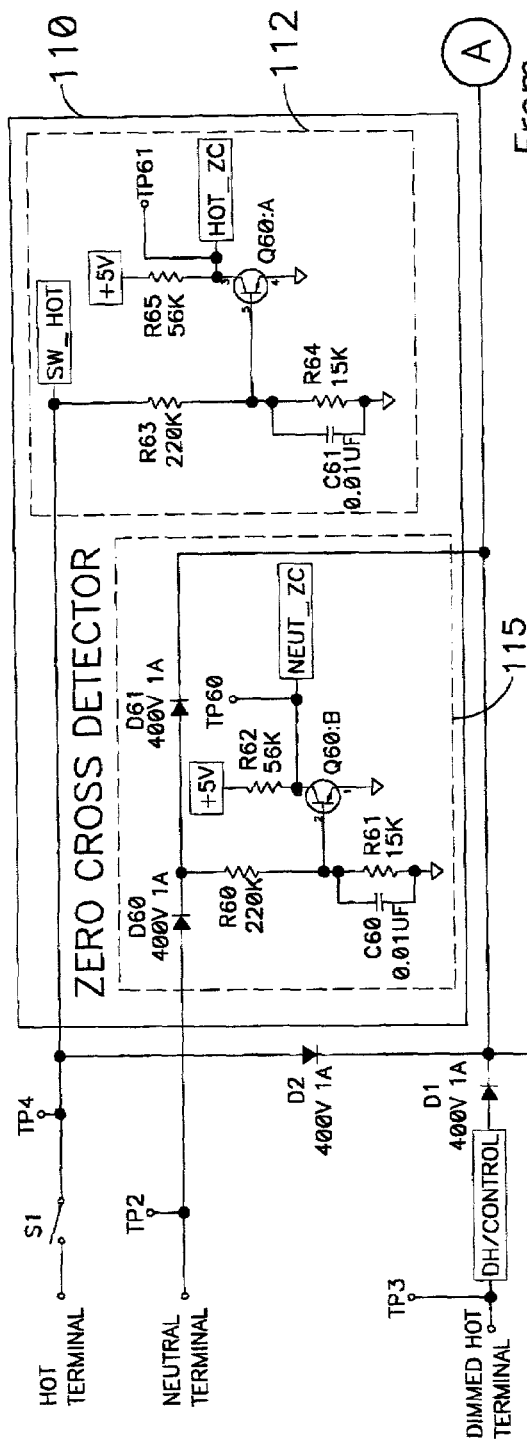
FIG. 3 is a circuit schematic diagram of a portion of an exemplary control system in accordance with the present invention.
Figure 3:
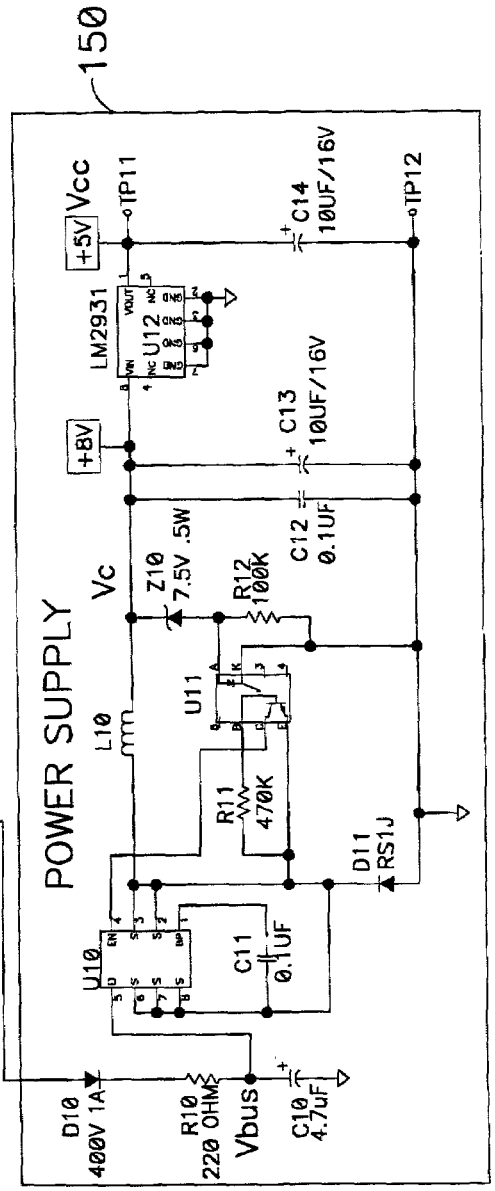

Regarding the zero crossing detector 110, an example of which is shown in further detail in FIG. 3, generation of the hot zero cross detection signal, which is used in the two wire mode, is accomplished via the hot zero cross detector 112 which is connected between the hot terminal and circuit common. Circuit common is connected to the dimmed hot terminal through the body diode of MOSFET Q102 and is connected to the hot terminal through the body diode of MOSFET Q101. Circuit common will have the same potential as the dimmed hot terminal during the positive half cycle of the AC line voltage and will have the same potential as the hot terminal during the negative half cycle of the AC line voltage. Resistors R63 and R64 divide down the voltage between hot and circuit common. When this divided down voltage reaches about 0.6V, transistor Q60:A will turn on, thereby pulling the normally logic high microprocessor port, HOT_ZC (shown in FIG. 6), to circuit common. The microprocessor senses this transition and thereby acquires the zero cross timing information. In detector 112, capacitor C61 is a noise decoupling capacitor.

When the neutral terminal of the electronic control system is connected to the neutral wire, it is desirable to acquire zero cross timing information from the neutral zero cross detector which is connected between the neutral terminal and hot terminal. Acquiring zero cross timing information in this manner is independent of the connected load and is not subject to variations in the load which can cause zero crossing time shifts particularly in the cases of magnetic or capacitive loads. In addition, zero cross information can be acquired even when the electronic control system is applying full line power to the load. When full power is being delivered to the load 200, the hot zero cross detector 112 does not produce a signal because the hot terminal and the dimmed hot terminal are at substantially the same potential and thus there is substantially no voltage between the hot terminal and circuit common.

Figure 6:
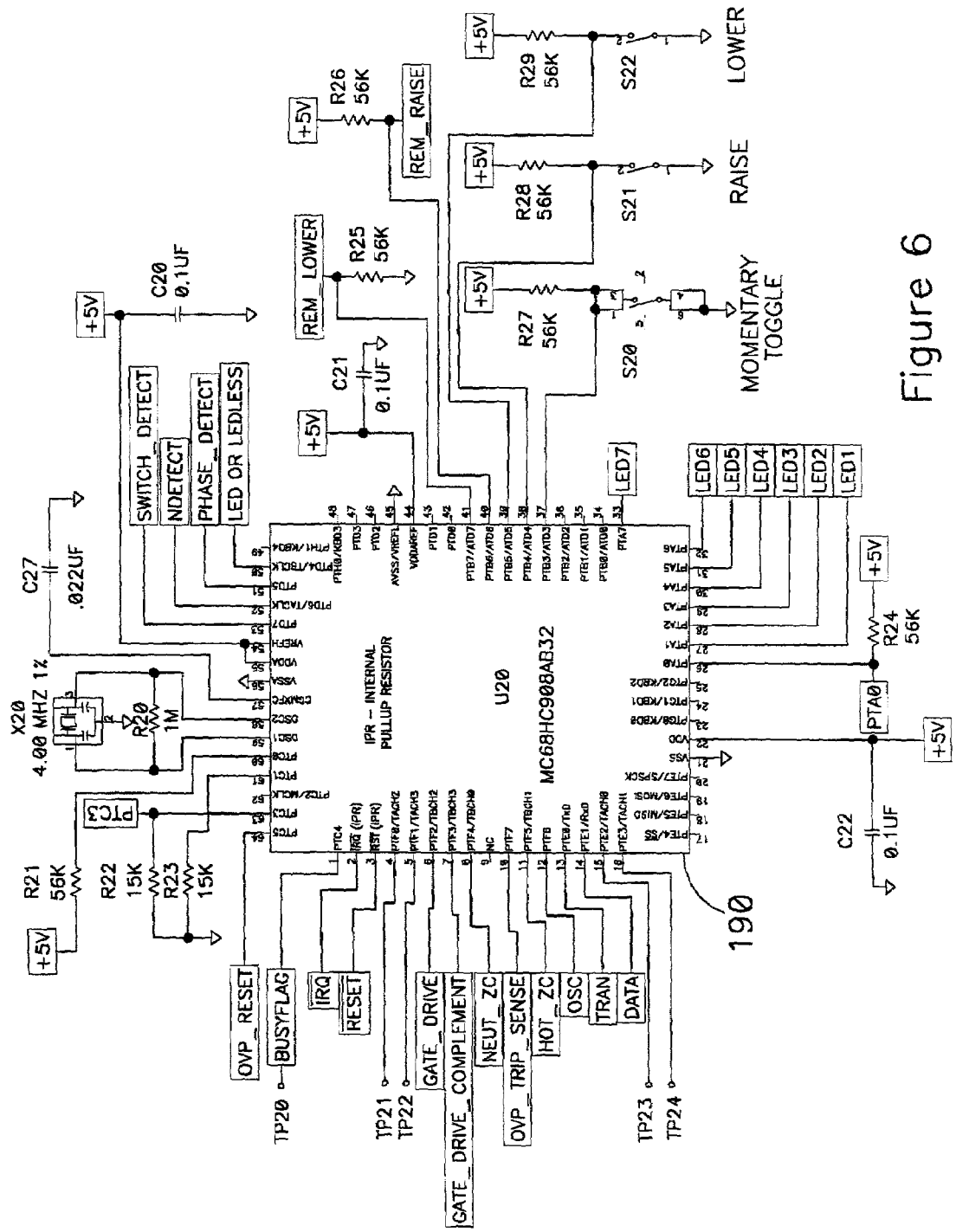
FIG. 6 is a circuit schematic diagram of another portion of an exemplary control system in accordance with the present invention.

The neutral zero cross detector 115 creates transitions in the same manner as the hot zero cross detector 112 but the output signals are connected to the NEUT_ZC microprocessor port. The neutral zero cross detector 115 employs two diodes that the hot zero cross detector 112 does not: diode D60 protects the base emitter junction of transistor Q60:B from exceeding its rated reverse voltage by blocking current flow when circuit common is at the same potential as the hot terminal; and diode D61 blocks current flow from the hot terminal, which would undesirably trigger the neutral zero cross detector 115 in the positive half cycle, when the MOSFETs Q101 and Q102 are non-conductive. The microprocessor 190 can be any type of microprocessor, such as a Motorola MC68HC908AB32, as shown in FIG. 6.

The zero cross detector described above provides zero cross timing information as well as neutral wire connection information to the microprocessor. A separate neutral wire connection detector could be provided which is separate from the zero cross detector described above. The primary function of a neutral wire connection detector is to indicate the presence of a neutral wire connection. The neutral wire connection detector can provide information to the microprocessor as to which of the two wire or three wire modes should be used. Other types of neutral wire connection detectors may be used, such as mechanical detectors, in which a mechanical sensor detects the presence of a neutral wire and provides information to the microprocessor as to the state of the neutral wire connection. A manual switch, or set of switches, such as a DIP switch could also be used to manually indicate the presence of a neutral wire connection.

Figure 9:
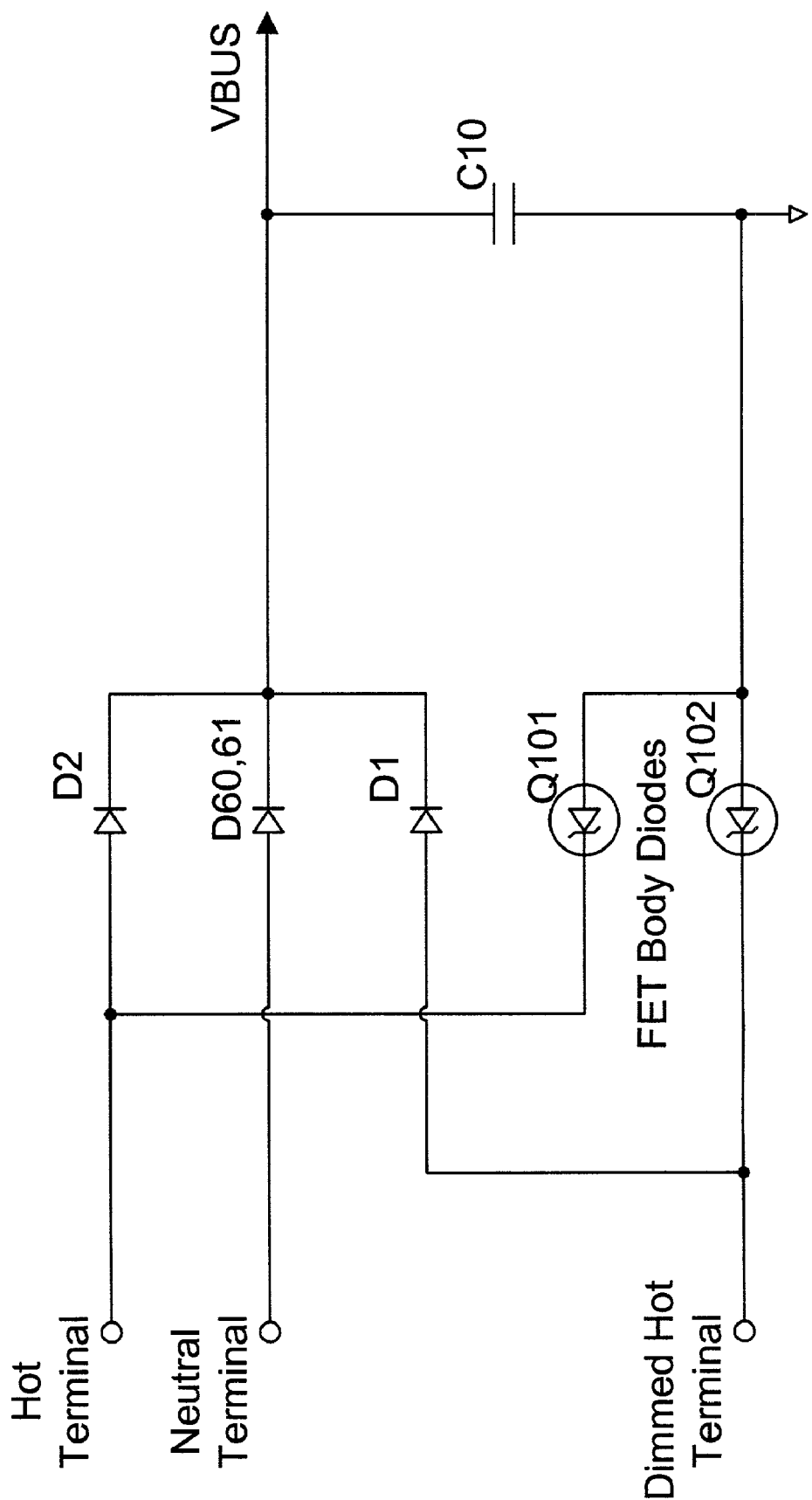
FIG. 9 is a simplified schematic diagram of an exemplary steering circuit in accordance with the present invention.

FIG. 9 is a simplified schematic diagram of an exemplary steering circuit that charges the bus capacitor C10 through the neutral terminal when a neutral wire is connected (e.g., in three wire mode). Capacitor C10 can be charged through multiple paths, from the hot terminal, neutral terminal, or dimmed hot terminal. The capacitor C10 is charged from the hot terminal through diode D2, from the neutral terminal through diodes 60, 61, and through the dimmed hot terminal through diode D1.

Typical prior art two wire electronic control systems control the power delivered to a load by making the controllably conductive devices conductive for a single selected portion of each AC line voltage half cycle. Prior to the time of an expected zero crossing of the AC line voltage, circuitry is enabled that opens a detection window to receive a zero cross signal. When the zero crossing signal is received, the electronic control system is synchronized to the AC line voltage and thus the conduction of the controllably conductive device is synchronized to the received zero crossing signal.

For an electronic control system operating in two wire mode, this control technique works well when the load impedance is primarily resistive. When this technique is used with electronic low voltage lighting loads a problem arises due to the complex input impedance of the electronic low voltage transformer. Typical electronic low voltage transformers operate by chopping the voltage applied to their input terminals at a high frequency and stepping down the chopped voltage through a high frequency transformer. The circuitry to perform this chopping action operates in different modes depending on the input voltage to the electronic transformer. When the input voltage is low, typically less than about 60 volts, the chopper circuit is not running and the input impedance of the transformer is very high and the input capacitor of the electronic transformer holds the actual value of the voltage on the transformer when the chopping action ceases. When the line voltage reaches about 60 volts, the chopper circuit begins running and the input impedance essentially drops to the impedance presented by the connected lamp load. Additionally, during the period when the chopper is not running, the input capacitor is susceptible to charging via any leakage path through the electronic control system. Since the leakage currents are variable and based on multiple parameters, the charging of the input capacitor of the electronic transformer is highly variable. This results in a variable voltage being present on the input capacitor of the electronic low voltage transformer at the start of an AC line voltage half cycle, effectively causing a variance in the initial conditions for the operation of the electronic low voltage transformer on a half cycle to half cycle basis. This variation interacts with the zero crossing detection circuitry of a typical two wire phase control electronic control system, such as that of a lighting controller, so as to cause an instability in the zero crossing signal. This instability in the zero crossing signal introduces an instability in the conduction time of the controllably conductive devices and thus a flicker effect in the connected lamp load.

In order to stabilize the zero crossing signal available in two wire mode for an electronic control system operating an electronic low voltage transformer, it is necessary to stabilize the initial voltage condition of the input capacitor of the electronic low voltage transformer near the zero crossing of an AC line voltage half cycle. It has been found that this can be accomplished by allowing a very brief period of conduction to occur near the time of the zero crossing of the AC line voltage half cycle. In one embodiment, the controllably conductive device in the electronic control system is controlled to be conductive for a duration of about 200 microseconds at a time about 1 millisecond before an AC line voltage zero crossing. This brief period of conduction when the AC line voltage is very low in absolute value effectively resets the input capacitor of the electronic low voltage transformer to a consistent initial condition and therefore stabilizes the zero crossing signal that is received in the electronic control system.

Figure 10:
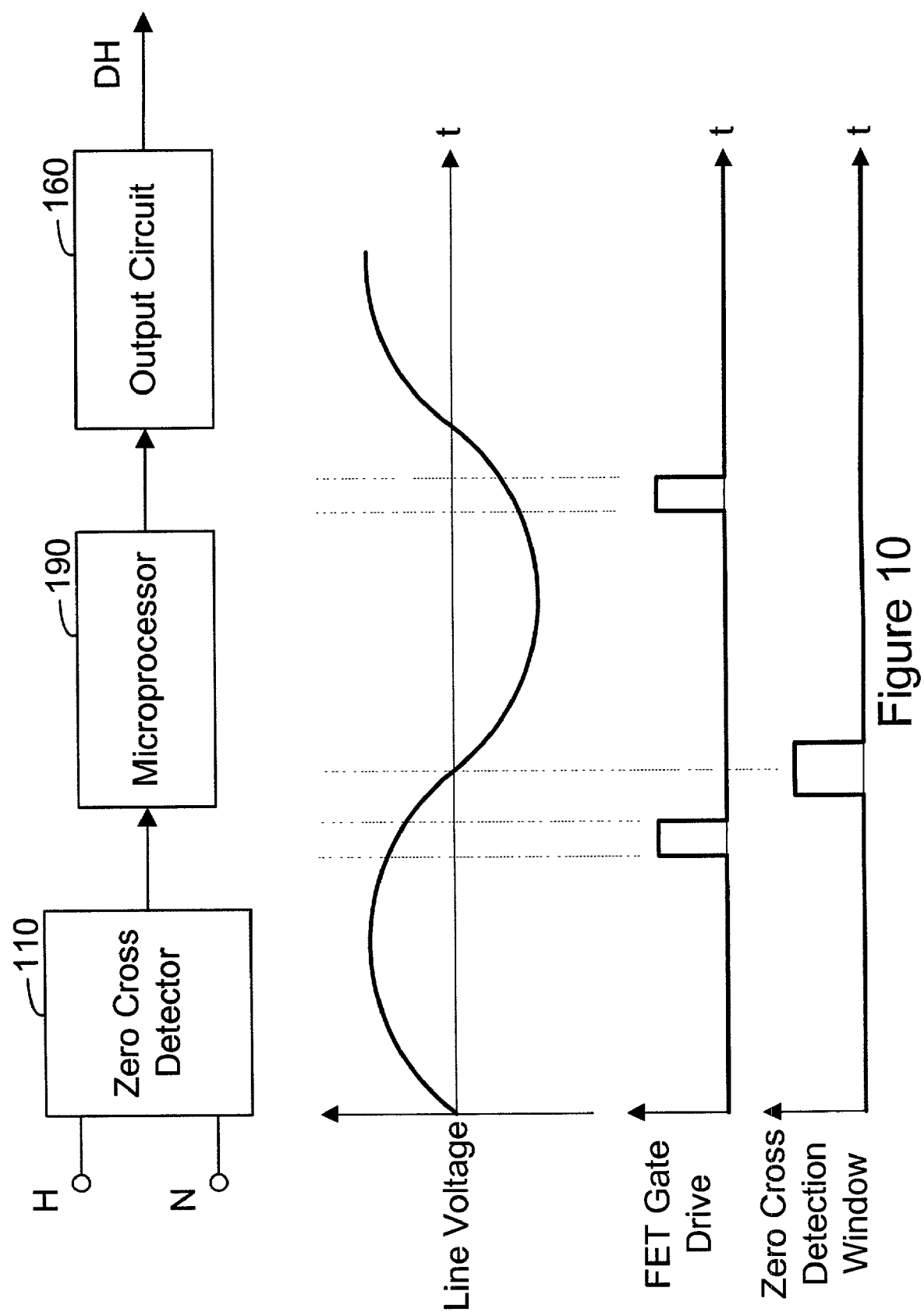
FIG. 10 is a simplified schematic diagram of an exemplary system used for eliminating false indication of zero crossing in accordance with the present invention along with exemplary timing diagrams.

FIG. 10 is a simplified block diagram of an exemplary circuit used for eliminating the instability of the zero crossing signal in accordance with the present invention along with exemplary timing diagrams.

For two wire operation, the transistors Q101 and Q102 of output circuit 160 are controlled to be conductive for a predetermined length of time at a predetermined point in time of each AC line voltage half cycle, prior to a time when the microprocessor opens a zero crossing detection window. For three wire operation, the transistors Q101 and Q102 preferably remain conductive through the time of AC line voltage zero crossing.

Figure 11:
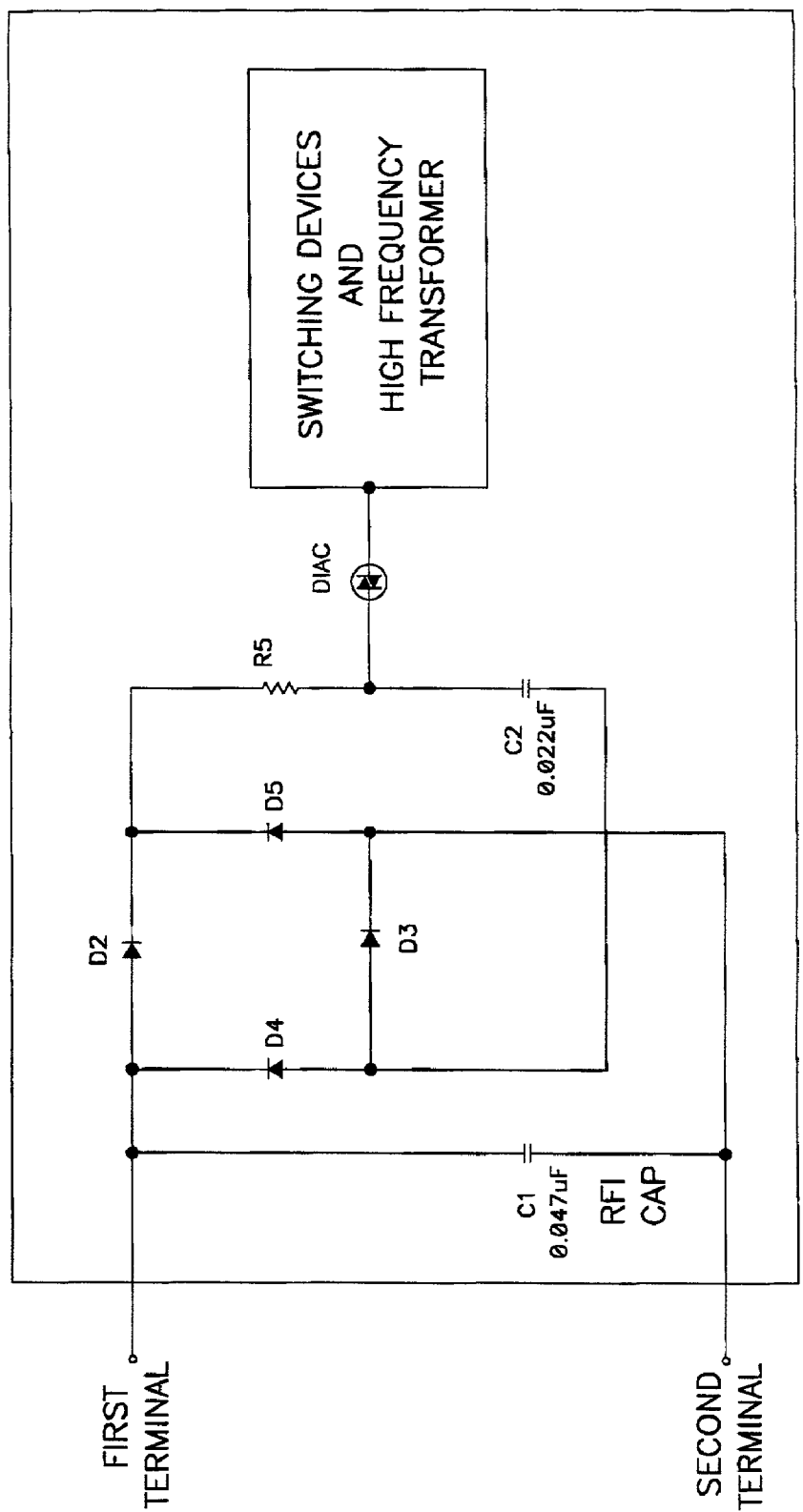
FIG. 11 is a circuit schematic diagram of an exemplary load for use with the present invention.

The load 200 (such as an electronic low voltage transformer shown in circuit schematic form in FIG. 11) is connected to the electronic control system 100. The load 200 comprises capacitors C1, C2 that get charged, and the voltage on these capacitors affects the operation of the electronic low voltage transformer operation and the zero crossing signal received by the electronic control system 100. In two wire mode, the zero crossing of the AC line voltage is detected by measuring the voltage drop across the dimmer ($V_{DIMMER}$) from the hot terminal to the dimmed hot terminal. However, when the MOSFETs Q101, Q102 are non conductive, such as during the time preceding an AC line voltage zero crossing, the voltage drop across the dimmer is equal to the AC line voltage ($V_{LINE}$) minus the voltage drop across the load 200 ($V_{LOAD}$). Because of leakage current through the dimmer, the capacitor C2 is able to charge toward some break-over voltage determined by the diac in the load 200. This causes the dimmer voltage $V_{DIMMER}$ to be lower than it would be otherwise. Undesirably, the load voltage $V_{LOAD}$ may not be consistent from one zero crossing detection window to the next, thereby causing the dimmer voltage $V_{DIMMER}$ to be inconsistent from one zero crossing detection window to the next. This problem can manifest itself to users as undesirable light flicker, especially at low ends when the lamp is dimmed.

Therefore, as previously discussed, to eliminate this problem in two wire mode, the transistors Q101 and Q102 are controlled to be conductive (FET gate drive high) for a predetermined time period (e.g., preferably at least about 200 $\mu$sec, and more preferably about 250 to 300 $\mu$sec) and then controlled to be non-conductive before the start of the next zero crossing detection window. The transistors Q101 and Q102 are controlled to be conductive at a line voltage sufficient to break-over the diac in the load 200. The transistors Q101 and Q102 are controlled to be non-conductive prior to the start of the zero crossing detection window. After the transistors Q101 and Q102 are controlled to be non-conductive, the microprocessor 190 opens or starts a zero crossing detection window and begins monitoring the zero cross detector 110 for the zero cross signal. Preferably, the zero crossing detection window is opened about 1 millisecond prior to where the zero cross signal is expected and closed about 2 milliseconds after being opened.

The minimum duration for which the MOSFETs Q101, Q102 are controlled to be conductive for the purpose of eliminating the instability of the zero crossing signal is determined by the desired effect upon a target set of electronic transformers for use with the electronic control system 100. That is, the MOSFETs must be on for a sufficient period of time, at a sufficiently high line voltage level, so that the control circuits in the target set of electronic transformers break over into conduction, thereby causing the voltage across the load to be returned to a consistent value from one zero crossing detection window to the next. The maximum duration for which the MOSFETs Q101, Q102 are controlled to be conductive for the purpose of eliminating the instability of the zero crossing signal is determined by many factors, such as the effect on visible light output from any lamp driven by the electronic low voltage transformer, and switching and conduction losses in the MOSFETs. For example, the longer the MOSFETs are allowed to remain in conduction, the more likely it is that current may flow through the load or that the light output may increase above a desired level.

The microprocessor 190 monitors the line frequency and determines where the next zero crossing detection window will be opened. Preferably, the zero crossing detection window is opened at a time prior to the next expected AC line voltage zero crossing that is about 10% of the measured period of the AC line voltage half cycle. The advantageous stabilization of the zero cross signal described above can also improve the operation of electronic control system operating in three wire mode by eliminating the effects of any leakage currents from the electronic control system that flow through the electronic low voltage transformer that may adversely effect the control circuits of the electronic control system. Additionally, since in three wire mode operation of an electronic control system the zero crossing signal is derived from the hot terminal and the neutral terminal, the controllably conductive devices can remain conductive through the time of the AC line voltage zero crossing while achieving the above mentioned advantageous effects of zero crossing stabilization.

Thus, for both two and three wire implementations, preferably, the zero crossing reference is reset regardless of the load. This provides a clear consistent zero crossing reference.

Figure 12:
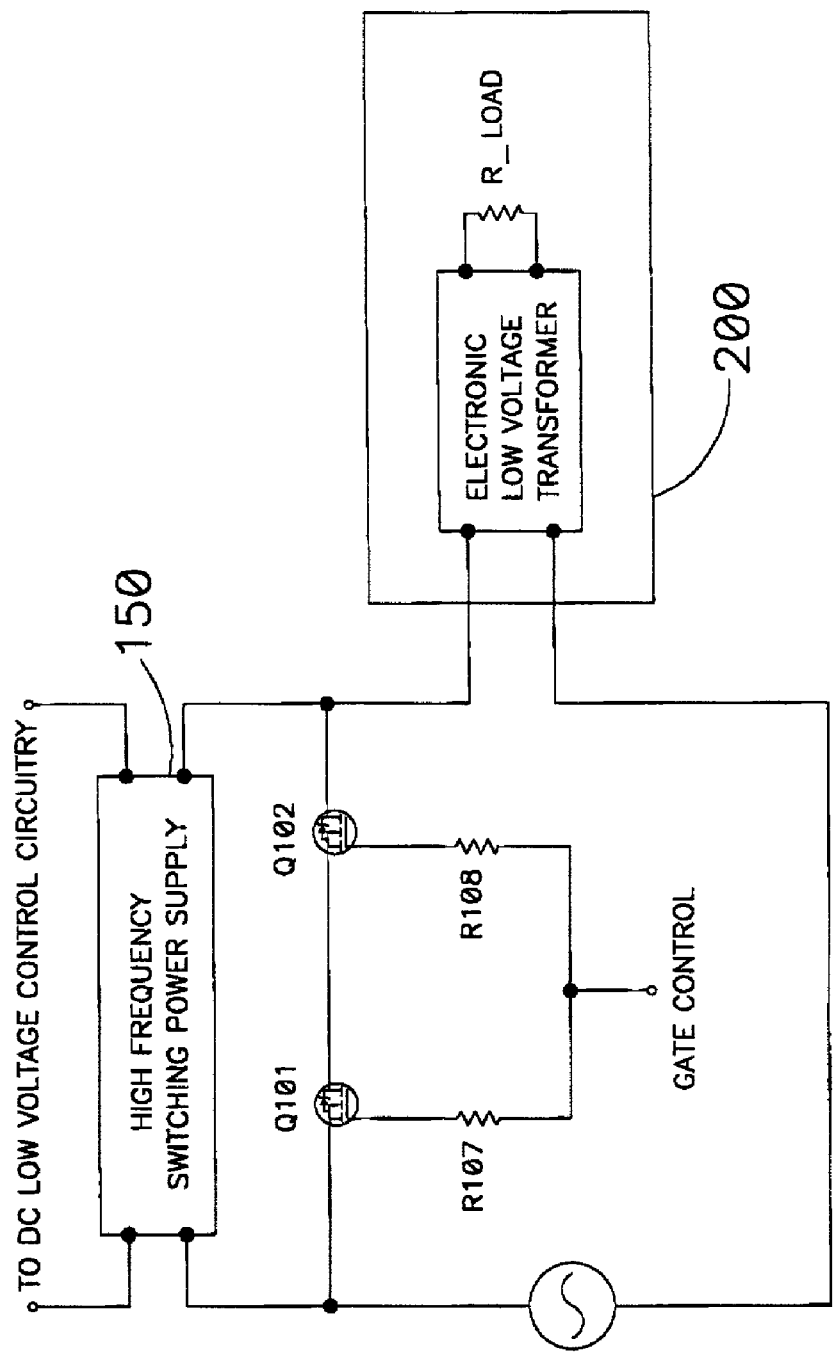
FIG. 12 is a block diagram of an exemplary system comprising a low voltage power supply in parallel to a high voltage controllably conductive device in accordance with the present invention.
Figure 13:
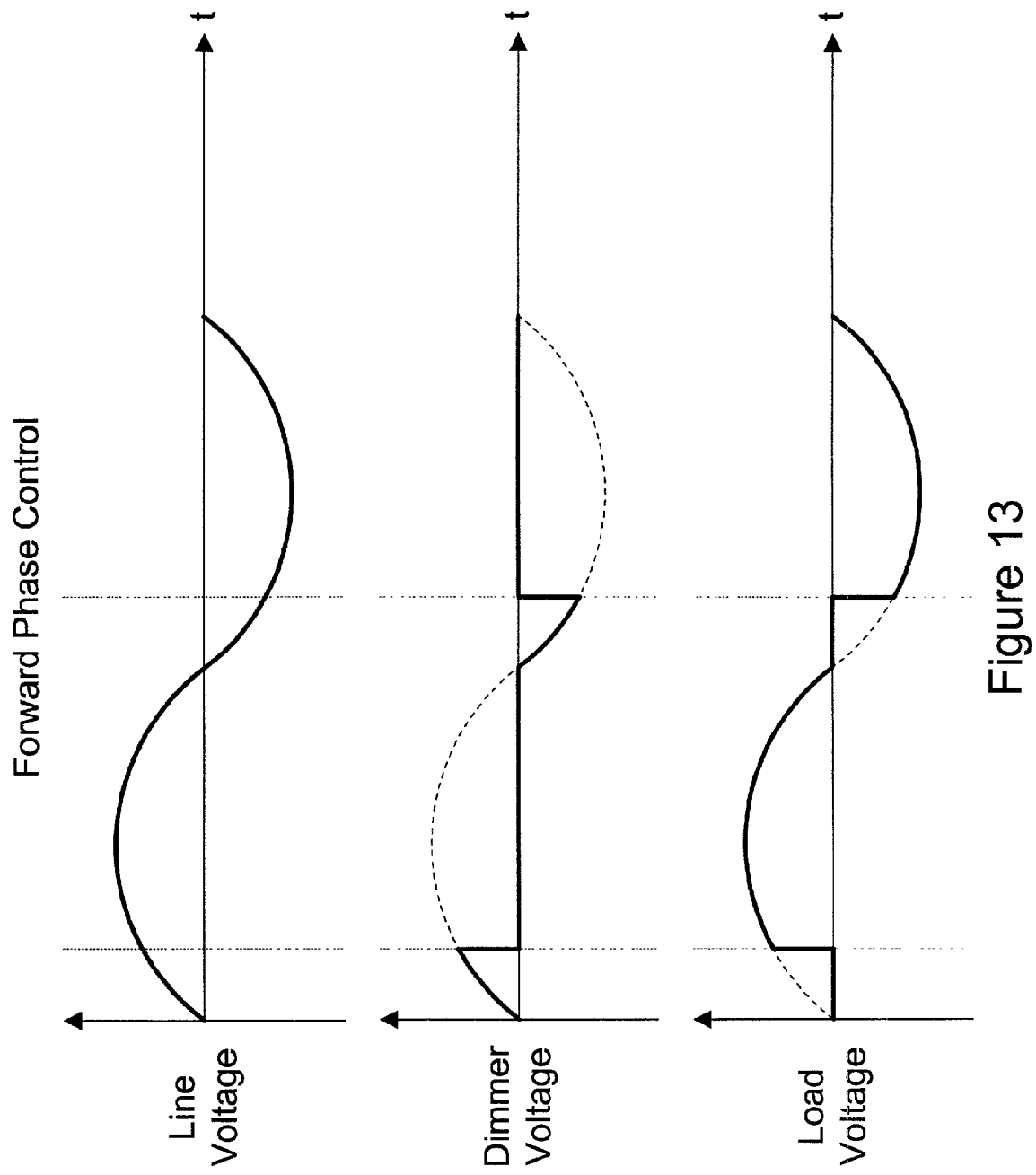
FIG. 13 is a diagram which illustrates an exemplary forward phase control waveform.
Figure 14:
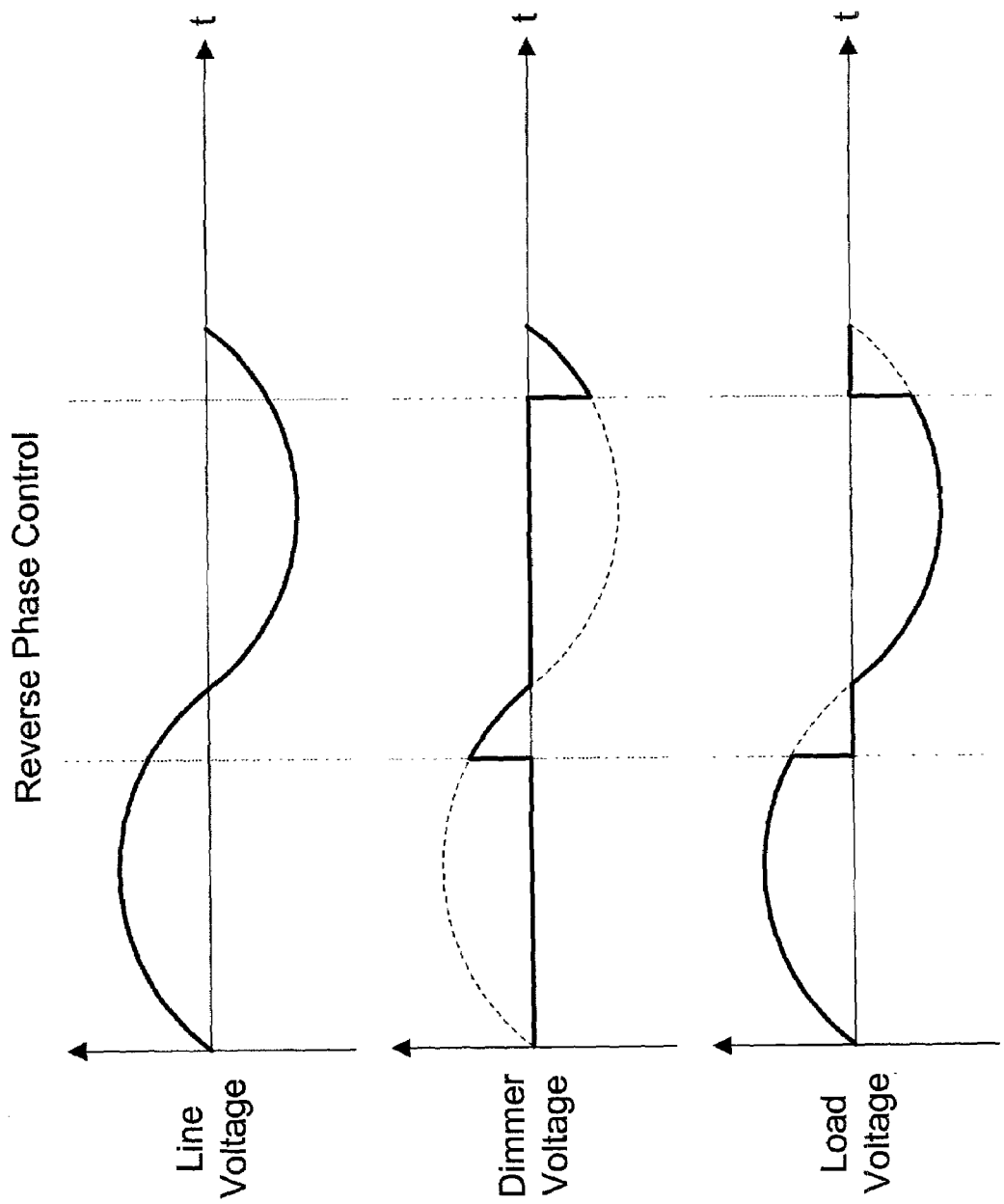
FIG. 14 is a diagram which illustrates an exemplary reverse phase control waveform.

FIG. 12 is a simplified schematic diagram of an exemplary high frequency switching power supply in parallel with controllably conductive devices Q110,Q102. The power supply 150 draws a low current through the high voltage load 200 by using a switching converter to efficiently convert the high voltage across controllably conductive devices Q101,Q102 to a low voltage supply voltage. The present embodiment comprises a combination of a switching converter connected in parallel with a pair of high voltage controllably conductive devices. The MOSFETs Q101,Q102 in FIG. 12 represent the high voltage controllably conductive devices. The gates of these devices Q101,Q102 are driven by control circuitry powered by the low voltage power supply 150. This combined system, in this case, is controlling one or more electronic low voltage transformers (load 200).

To further describe aspects of the invention, a conventional linear regulator cat ear power supply used for prior art two wire mode dimmers is typically about 10% efficient at converting power from a high voltage source to a low voltage load (i.e., control circuitry), whereas the power supply of the invention has an efficiency of about 75%. For electronic controls system requiring on the order of about 50 to 100 mW of power to operate their control circuits, about 0.5 to 1 watt of power would be dissipated in the power supply. In general, this has not been a significant issue. However, associated with the low efficiency of the cat ear power supply are high peak and average input currents into the power supply for a given average output current. Generally, the peak current into a cat ear power supply is at least 10 times the average output current. In the case of two wire mode dimmers, the peak current drawn by a cat ear power supply through the connected load can cause the load to make audible noise, particularly in the off state when the load is expected to have no significant current flowing through it. The high average current of the cat ear power supply when directed through an electronic low voltage transformer can cause flicker due to variations in the zero cross signal as described above. Additionally, the efficiency of the cat ear power supply deteriorates as the difference between input voltage and output voltage increases. Therefore, operating the cat ear power supply beyond about the first 1 millisecond of the AC line voltage after a zero crossing is fundamental limitation. This limit of available conduction time for the cat ear power supply correspondingly causes the input peak current to rise significantly if a small additional average output current is required.

In contrast to the disadvantages of the prior art power supply, the power supply of the invention has many advantages. The efficiency of the power supply is preferably about 75%. Therefore, for a given power requirement of the power supply, the average and peak input currents of the power supply of the invention will be significantly lower than those of the prior art power supply (e.g., the cat ear power supply). These lower input currents are especially advantageous when operating electronic low voltage transformer type loads. Indeed, even a power supply with an efficiency of about 50% represents a significant improvement. Further, the efficiency is reasonably independent of the difference between the input and output voltage of the power supply. Hence, the power supply of the invention is not limited to operation around the time of the AC line voltage zero cross as is the prior art cat ear power supply. Indeed, one of the advantages of the power supply of the invention is the ability to draw input current throughout the duration of the AC line voltage half cycle.

The power supply of the invention preferably uses a buck converter configuration to accomplish the stepping down of the voltage. It will be apparent to one having ordinary skill in the art that other efficient high frequency switching regulators may be employed. Another such configuration is the flyback converter.

The invention may be embodied in the form of appropriate computer software, or in the form of appropriate hardware or a combination of appropriate hardware and software without departing from the spirit and scope of the present invention. Further details regarding such hardware and/or software should be apparent to the relevant general public. Accordingly, further descriptions of such hardware and/or software herein are not believed to be necessary.

Although illustrated and described herein with reference to certain specific embodiments, the present invention is nevertheless not intended to be limited to the details shown. Rather, various modifications may be made in the details within the scope and range of equivalents of the claims and without departing from the invention.

What is claimed is:

1. An electronic control system operable in a two wire mode and a three wire mode, comprising:
a detector having a hot input terminal and a neutral input terminal and generating at least one output signal, the output signal used to automatically operate the electronic control system in one of the two wire mode and the three wire mode.

2. The system of claim 1, wherein the at least one output signal comprises a hot zero cross detection signal and a neutral zero cross detection signal, and wherein the detector comprises:
a hot zero cross detector coupled to the hot input terminal to generate the hot zero cross detection signal; and
a neutral zero cross detector coupled to the neutral input terminal to generate the neutral zero cross detection signal.

3. The system of claim 1, further comprising a microprocessor coupled to the detector to monitor the output signal and select one of the two wire mode and the three wire mode responsive to the output signal.

4. An electronic control system connectable to a source of electric power, operable in a two wire mode and a three wire mode, comprising a hot terminal, a dimmed hot terminal, a neutral terminal and a power supply, the power supply drawing a power supply current from the source of electric power, wherein said power supply current only flows between the hot terminal and the dimmed hot terminal when said electronic control system is operating in said two wire mode, and wherein a portion of said power supply current flows between the hot terminal and neutral terminal when said electronic control system is operating in said three wire mode.

5. The power supply of claim 4, wherein the power supply comprises a high frequency switching power supply.

6. An apparatus for controlling the amount of power delivered from a source of power to a load comprising:
a first main terminal and a second main terminal, said first main terminal connectable to said source of power and said second main terminal connectable to said load to allow current to flow from said source of power to said load;

a power supply that draws a power supply current from said source of power through said load;

a third terminal connectable to said source of power, wherein when said third terminal is energized by said source of power a portion of said power supply current flows through said third terminal instead of through said load.

7. The apparatus of claim 6, wherein said first main terminal is connectable to a hot terminal of said source of power.

8. The apparatus of claim 7, wherein said third terminal is connectable to a neutral connection of said source of power.

9. The apparatus of claim 6, further comprising a diode that steers said portion of said power supply current through said third terminal instead of through said load.

10. A method of reducing flicker in a lamp driven by an electronic transformer in a system powered by an AC line voltage, comprising the steps of:

providing current to said electronic transformer trough a series connectable dimming circuit, wherein said current flows for a user selectable first conduction time in an AC line voltage half cycle; and providing a non-overlapping second conduction time in the same half cycle of the AC line voltage just prior to the next zero crossing of the AC line voltage.

11. The method of claim 10, wherein said second conduction time is a fixed amount of time.

12. The method of claim 10, wherein said fixed amount of time is about 200 microseconds.

13. The method of claim 10, wherein said second conduction time ends about 1000 microseconds before said next zero crossing of said AC line voltage.

14. A power controlling device for controlling the amount of power delivered from a source of power to a load comprising:

a first and a second main terminal, said first main terminal connectable to said source of power, said second main terminal connectable to said load to allow current to flow from said source of power to said load; and a power supply that draws a power supply current from said source of power and through said load, said power supply having an efficiency greater than about 50%.

15. The power controlling device of claim 14, wherein said power supply is a switching type power supply.

16. The power controlling device of claim 15, wherein said power supply is a buck converter type switching supply.

17. The power controlling device of claim 15, wherein said power supply is a flyback type switching supply.

18. The power controlling device of claim 14, further including a controllably conductive device connected to said first main terminal and said second main terminal, wherein said power supply is operable during both times of conduction and non-conduction of said controllably conductive device.

19. The power controlling device of claim 14, wherein said power supply is constrained to run only during selected times of the AC line voltage half cycle.

* * * * *

UNITED STATES PATENT AND TRADEMARK OFFICE
CERTIFICATE OF CORRECTION

PATENT NO. : 6,969,959 B2
DATED : November 29, 2005
INVENTOR(S) : Richard L. Black et al.

It is certified that error appears in the above-identified patent and that said Letters Patent is hereby corrected as shown below:

Title page,
Item [75], Inventors, should read:
-- Richard L. Black, Gilbertsville, PA (US); Benjamin Aaron Johnson, Lansdale, PA (US); Shawn L. Leichliter, Allentown, PA (US); Robert C. Newman, Jr., Emmaus, PA (US); Chenming Wu, Allentown, PA (US). --.

Column 1,
Line 28, after "longer" insert -- is --;
Lines 29 and 31, after "power" insert -- that is --;
Line 30, after "shorter" insert -- is --;
Line 33, delete "loads," and insert -- loads: --.

Column 3,
Lines 4-5, "controls rating" should read -- control's rating --.

Column 7,
Line 45, replace "thereby turning transistor off Q100:B" with --thereby turning off transistor Q100:B --;
Line 45, replace "thereby turning transistor off" with -- hereby turning off transistor Q100:A --.

Column 12,
Line 60, after "of electronic control system" insert -- of the electronic control system --.

Column 13,
Line 11, "Q110" should read -- Q101 --;
Line 52, after "crossing is" insert -- a --.

UNITED STATES PATENT AND TRADEMARK OFFICE
CERTIFICATE OF CORRECTION

PATENT NO. : 6,969,959 B2
DATED : November 29, 2005
INVENTOR(S) : Richard L. Black et al.

It is certified that error appears in the above-identified patent and that said Letters Patent is hereby corrected as shown below:

Column 15,
Line 22, "trough" should read -- through --;
Line 31, delete "claim 10" and insert -- claim 11 --.

Signed and Sealed this

Twenty-first Day of February, 2006

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 6,969,959 B2 | Page 1 of 1 |
| APPLICATION NO. | : 10/013746 | |
| DATED | : November 29, 2005 | |
| INVENTOR(S) | : Richard L. Black et al. | |

It is certified that error appears in the above-identified patent and that said Letters Patent is hereby corrected as shown below:

At (75) Inventors, on first page of patent, the inventor listed should be:
Richard L. Black, Gilbertsville, PA (US); Benjamin Aaron Johnson, Lansdale, PA (US); Shawn L. Leichliter, Allentown, PA (US); Robert C. Newman, Jr., Emmaus, PA (US); Chenming Wu, Allentown, PA (US).

Column 1, line 28, after "longer" insert --is--;
Column 1, line 29, after "power" insert --that is--;
Column 1, line 30, after "shorter" insert --is--;
Column 1, line 31, after "power" insert --that is--;
Column 1, line 33, delete "loads," and insert --loads:--
Column 3, line 4-5, "controls rating" should read --control's rating--
Column 7, line 45, replace "thereby turning transistor off Q100:B" with --thereby turning off transistor Q100:B--
Column 12, line 60, replace "of electronic control system" with --of the electronic control system--;
Column 13, line 11, "Q110" should read --Q101--
Column 13, line 52, after "crossing is" insert --a--;
Column 15, line 22, "trough" should read --through--
Column 15, claim 12, 1$^{st}$ line, delete "claim 10" and insert --claim 11-- therefor.

Signed and Sealed this

Tenth Day of October, 2006

JON W. DUDAS
*Director of the United States Patent and Trademark Office*

UNITED STATES PATENT AND TRADEMARK OFFICE
CERTIFICATE OF CORRECTION

PATENT NO. : 6,969,959 B2  Page 1 of 1
APPLICATION NO. : 10/013746
DATED : November 29, 2005
INVENTOR(S) : Richard L. Black et al.

It is certified that error appears in the above-identified patent and that said Letters Patent is hereby corrected as shown below:

At (75) Inventors, on first page of patent, the inventor listed should be:
Richard L. Black, Gilbertaville, PA (US); Benjamin Aaron Johnson, Lansdale, PA (US); Shawn L. Leichliter, Allentown, PA (US); Robert C. Newman, Jr., Emmaus, PA (US); Chenming Wu, Allentown, PA (US).

Column 1, line 28, after "longer" insert --is--;
Column 1, line 29, after "power" insert --that is--;
Column 1, line 30, after "shorter" insert --is--;
Column 1, line 31, after "power" insert --that is--;
Column 1, line 33 delete "loads," and insert --loads:--
Column 3, line 4-5, "controls rating" should read --control's rating--
Column 7, line 45, replace "thereby turning transistor off Q100:B" with --thereby turning off transistor Q100:B--
Column 12, line 60, replace "of electronic control system" with --of the electronic control system--;
Column 13, line 11, "Q110" should read --Q101--
Column 13, line 52, after "crossing is" insert --a--;
Column 15, line 22. "trough" should read --through--
Column 15, claim 12, 1st line, delete "claim 10" and insert --claim 11-- therefor.

Signed and Sealed this

Twelfth Day of December, 2006

JON W. DUDAS
*Director of the United States Patent and Trademark Office*

UNITED STATES PATENT AND TRADEMARK OFFICE
CERTIFICATE OF CORRECTION

PATENT NO. : 6,969,959 B2  Page 1 of 1
APPLICATION NO. : 10/013746
DATED : November 29, 2005
INVENTOR(S) : Richard L. Black et al.

It is certified that error appears in the above-identified patent and that said Letters Patent is hereby corrected as shown below:

At (75) Inventors, on first page of patent, the inventor listed should be:
Richard L. Black, Gilbertsville, PA (US); Benjamin Aaron Johnson, Lansdale, PA (US); Shawn L. Leichliter, Allentown, PA (US); Robert C. Newman, Jr., Emmaus, PA (US); Chenming Wu, Allentown, PA (US).

Column 1, line 28, after "longer" insert --is--;
Column 1, line 29, after "power" insert --that is--;
Column 1, line 30, after "shorter" insert --is--;
Column 1, line 31, after "power" insert --that is--;
Column 1, line 33 delete "loads," and insert --loads:--
Column 3, line 4-5, "controls rating" should read --control's rating--
Column 7, line 45, replace "thereby turning transistor off Q100:B" with --thereby turning off transistor Q100:B--
Column 12, line 60, replace "of electronic control system" with --of the electronic control system--;
Column 13, line 11, "Q110" should read --Q101--
Column 13, line 52, after "crossing is" insert --a--;
Column 15, line 22, "trough" should read --through--
Column 15, claim 12, 1st line, delete "claim 10" and insert --claim 11-- therefor.
This certificate supersedes Certificate of Correction issued December 12, 2006.

Signed and Sealed this

Seventh Day of August, 2007

JON W. DUDAS
*Director of the United States Patent and Trademark Office*